United States Patent [19]

Sandhu et al.

[11] Patent Number: 5,258,637
[45] Date of Patent: Nov. 2, 1993

[54] SEMICONDUCTOR DEVICES PRODUCED ACCORDING TO A METHOD WHICH REDUCES CONTACT RESISTANCE AT SILICIDE/ACTIVE AREA INTERFACES

[75] Inventors: Gurtej S. Sandhu; Mohammed Anjum, both of Boise, Id.

[73] Assignee: Micron Technology, Inc., Boise, Id.

[21] Appl. No.: 849,685

[22] Filed: Mar. 11, 1992

Related U.S. Application Data

[62] Division of Ser. No. 764,352, Sep. 23, 1991, Pat. No. 5,108,954.

[51] Int. Cl.$^5$ .................. H01L 23/48; H01L 29/40
[52] U.S. Cl. ............................ 257/384; 257/382; 257/754
[58] Field of Search ............ 257/382, 383, 384, 385, 257/377, 576, 754, 757, 768, 769, 770

[56] References Cited

U.S. PATENT DOCUMENTS

4,835,112  5/1989  Pfiester et al. ................ 257/900
5,156,994  10/1992  Moslehi ......................... 437/200

*Primary Examiner*—Sara W. Crane
*Attorney, Agent, or Firm*—Wells, St. John, Roberts, Gregory & Matkin

[57] ABSTRACT

Disclosed is a semiconductor processing method for reducing contact resistance between an active area and an overlying silicide resulting from diffusion of an impurity from the active area into the silicide. The method comprises implanting germanium through the contact opening and into the active area of the wafer to a peak density at an elevation which is at or above the elevation of the peak density of the conductivity enhancing impurity. A layer of metal is applied atop the wafer and into the contact opening to contact the active area. The metal and silicon within the contact opening are annealed to form a metal silicide. The annealing step consumes elemental silicon into the wafer to an elevation which is at or above the elevation of the germanium peak density. The germanium restricts diffusion of the conductivity enhancing impurity therethrough during the silicide anneal.

9 Claims, 6 Drawing Sheets

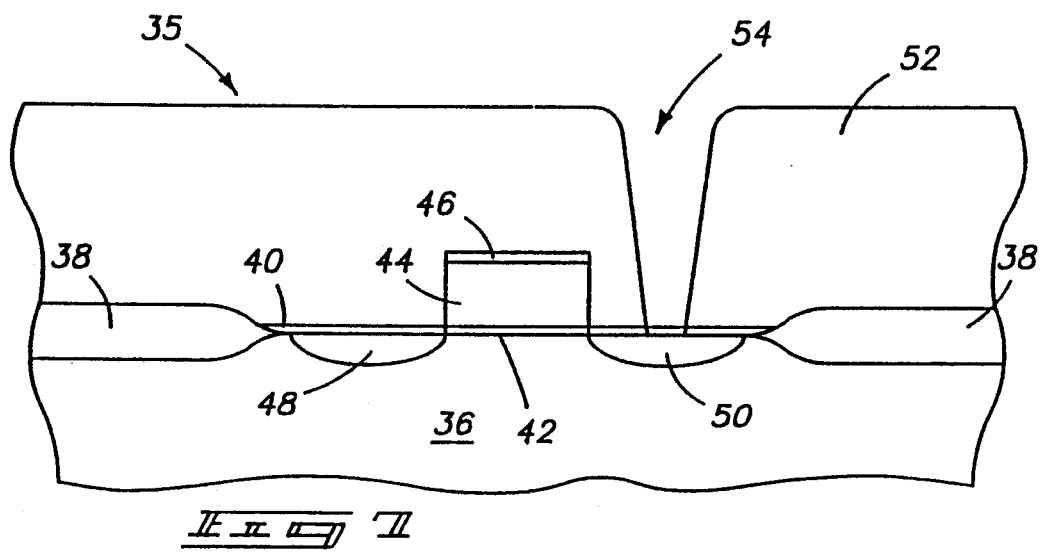
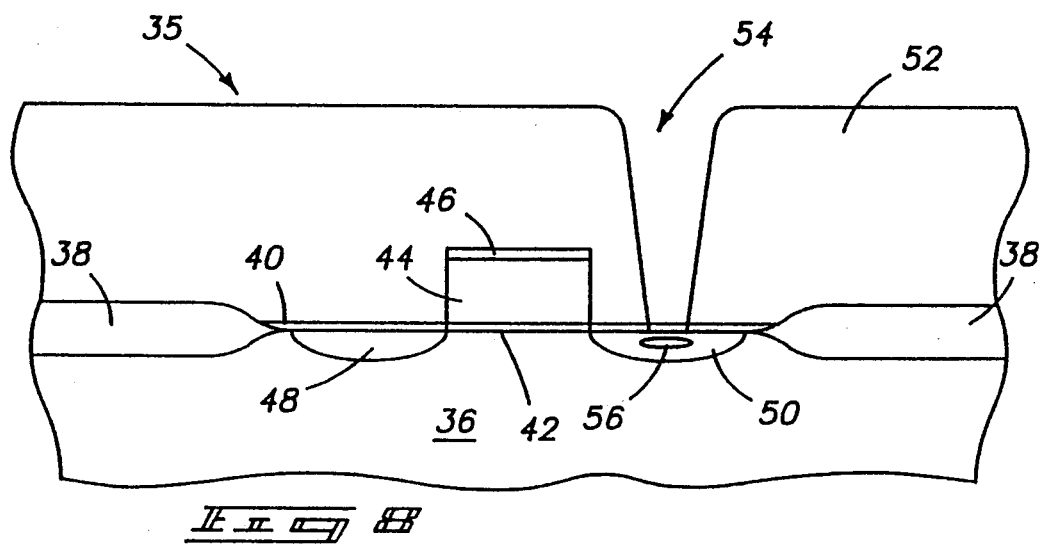
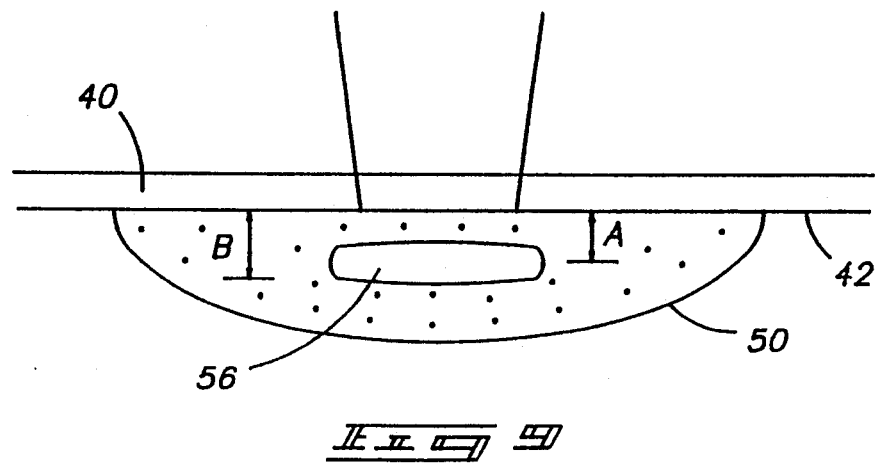

SEMICONDUCTOR DEVICES PRODUCED ACCORDING TO A METHOD WHICH REDUCES CONTACT RESISTANCE AT SILICIDE/ACTIVE AREA INTERFACES

RELATED PATENT DATA

This patent resulted from a divisional application of U.S. patent application Ser. No. 07/764,352 entitled "Method of Reducing Contact Resistance at Silicide/Active Area Interfaces and Semiconductor Devices Produced According to the Method", filed Sep. 23, 1991 which is now U.S. Pat. No. 5,108,954.

TECHNICAL FIELD

This invention relates generally to semiconductor processing methods. More specifically, this invention relates to methods for reducing contact resistance between an active area and an overlying silicide which results from diffusion of a conductivity enhancing impurity from the active area into the silicide during the silicidation anneal.

BACKGROUND OF THE INVENTION

As circuit complexity and density increase, the depth of source drain regions becomes shallower. Further, contact openings formed in dielectric layers in high density circuits typically have high aspect ratios. This results in poor step coverage of the metal layer for formation of the silicide and the overlying common barrier metal layer. These factors can combine to give rise to very high contact resistance.

Depletion of the surface concentration of the conductivity enhancing impurity in the active area has been identified as one possible reason for the adverse high contact resistance. Such is believed to occur at the formation of the contact silicide. Silicides are typically formed between the active area and overlying metal runner to reduce contact resistance. Such are formed by application of a thin metal layer over the wafer which intimately contacts the upper surface of the active area within the contact opening. An elevated temperature anneal reacts the metal with the silicon of the active area (substrate) forming a silicide in the process. A common metal for formation of a silicide is titanium, which forms titanium silicide (TiS$_2$). However during the silicide formation, especially with shallow active areas, an adverse phenomenon can result which actually increases resistance from the contact to the active area. The problem is described with reference to FIGS. 1, 1A, 1B, 2, and 3.

FIG. 1 illustrates a portion of a semiconductor wafer fragment 10 comprised of a silicon substrate 12 with a source/drain active area 14 provided therein. A polysilicon gate 16 overlies a gate oxide layer 18 adjacent active area region 14. A layer of insulating oxide 20 is provided, with a contact opening 22 having been etched therein to contact active source/drain area 14. A metal layer 24, such as titanium, is applied atop etched oxide layer 20 and contacts source/drain active area 14 for formation of the metal silicide.

FIG. 1A is an enlargement of the FIG. 1 wafer as represented by the dashed circle 1A in FIG. 1. The "dots" within active area 14 in FIG. 1A represents the conductivity enhancing impurity doped within silicon substrate 12 which generally defines a rough boundary for active area 14 after the activation anneal for the active area. The dotted line 26 extending from the base of contact opening 22 into active area 14 roughly represents that area of the silicon from active area 14 that will react with the titanium of layer 24 for formation of TiSi$_2$. Arrows are shown in FIG. 1A which extend from the conductivity enhancing impurity dots which are in closest proximity to the region defined by dotted line 26. During the elevated temperature anneal to form the silicide, the conductivity enhancing impurity tends to diffuse towards and into the silicide region defined by boundary 26, as indicated by the arrows.

FIG. 1B illustrates the effect at the conclusion of the silicidation anneal. A silicide region 28 is formed which has attracted adjacent conductivity enhancing impurity from within active region 14. This creates a slight void between the outline 26 of silicide region 28 and conductivity enhancing impurity within active area 14, thus significantly increasing resistance of contact through opening 22 to active area 14.

The problem is represented graphically in FIGS. 2 and 3. Each includes a plot of concentration versus depth (elevation) into the substrate from the original upper silicon surface. FIG. 2 illustrates the concentration versus depth profile of a conductivity enhancing impurity, such as boron, after implantation and post implant anneal. FIG. 3 illustrates the curved profile after silicidation. As is apparent, the concentration of boron at the TiSi$_2$ interface (the location where the boron curve meets the TiSi$_2$ boundary) is less than what was depicted by the original boron concentration curve. In other words, the boron concentration as a function of depth has been changed by the silicidation which withdraws boron into the silicide region. Such can result in significant resistance and a failure to make electrical contact.

It would be desirable to overcome these and other drawbacks of the prior art.

BRIEF DESCRIPTION OF THE DRAWINGS

Preferred embodiments of the invention are described below with reference to the accompanying drawings.

FIG. 7 is a sectional view of the FIG. 4 wafer at a processing step subsequent to that illustrated by FIG. 4.

FIG. 8 is a sectional view of the FIG. 4 wafer at a processing step subsequent to that shown by FIG. 7.

FIG. 9 is an enlarged view of a portion of the FIG. 8 wafer.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with the invention, a semiconductor processing method for reducing contact resistance between an active area and an overlying silicide resulting from diffusion of an impurity from the active area into the silicide comprises the following steps:

providing field oxide regions atop a silicon wafer, the silicon wafer having a starting upper silicon surface;

implanting a first type conductivity enhancing impurity into the silicon wafer to a first peak density at a first elevation relative to the starting upper silicon surface to define an active area, the first type conductivity implanting occurring after provision of the field oxide regions;

post-implant annealing the active area to, a) transform the first peak density at the first elevation into a second peak density at a second elevation relative to the starting upper silicon surface, the second peak density being less than the first peak density, the second elevation being below the first elevation, b) repair crystal damage imparted to the wafer the result of the implant, and c) electrically enable the active area;

providing a layer of insulating dielectric atop the wafer;

selectively patterning and etching the insulating dielectric to provide a contact opening to the active area, the contact opening upwardly exposing only a portion of the silicon of the active area;

after annealing the active area, implanting germanium through the contact opening and into the active area of the wafer to a third peak density at a third elevation relative to the starting upper silicon surface, the third elevation being at or above the second elevation;

applying a layer of metal atop the wafer and into the contact opening to contact the active area, the metal within the contact engaging an upper surface of the silicon of the active area; and after implanting the germanium, annealing the metal and silicon within the contact opening to form a metal silicide; the annealing step consuming elemental silicon into the wafer to a fourth elevation relative to the starting upper silicon surface in formation of the silicide, the fourth elevation being at or above the third elevation; the germanium restricting diffusion of the conductivity enhancing impurity therethrough during the silicide annealing.

Figure 1:
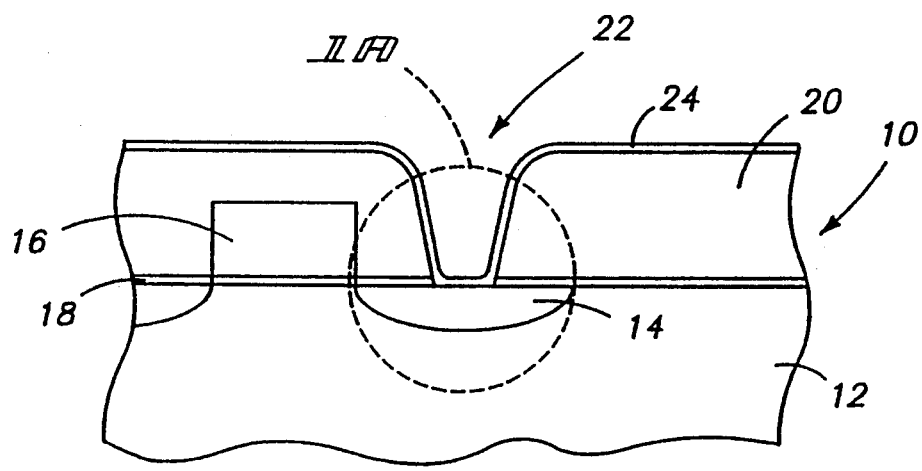
FIG. 1 is a diagrammatic sectional view of a semiconductor wafer fragment of the prior art, and is described in the "Background" section above.
Figure 1A:
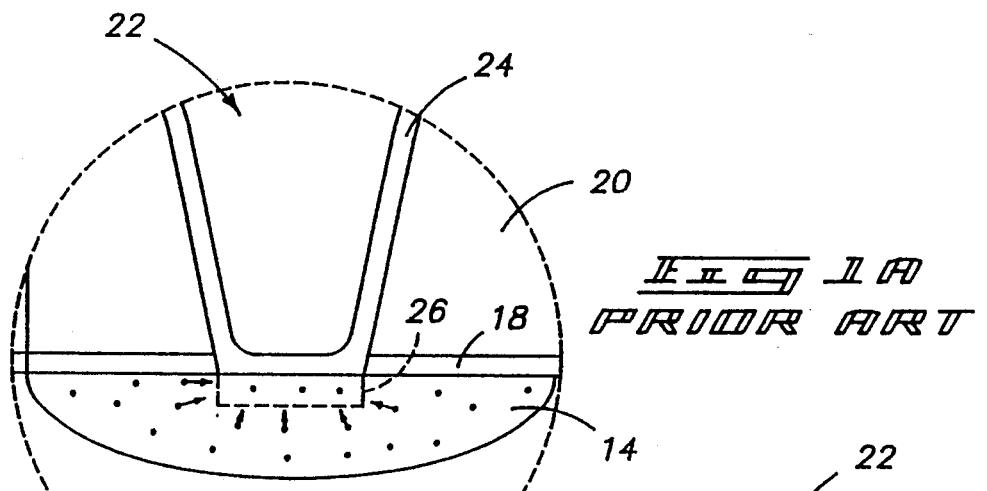
FIG. 1A is an enlarged view of a portion of the FIG. 1 wafer as depicted by the circle 1A in FIG. 1.
Figure 1B:
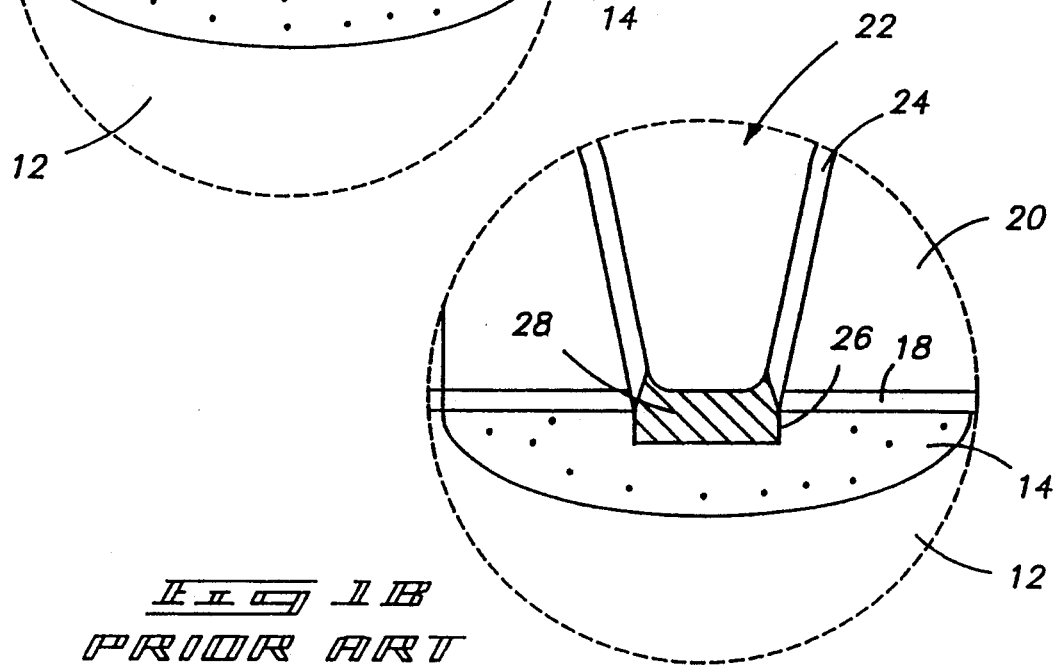
FIG. 1B is a view of the FIG. 1 wafer at a processing step subsequent to that illustrated by FIG. 1A.
Figure 2:
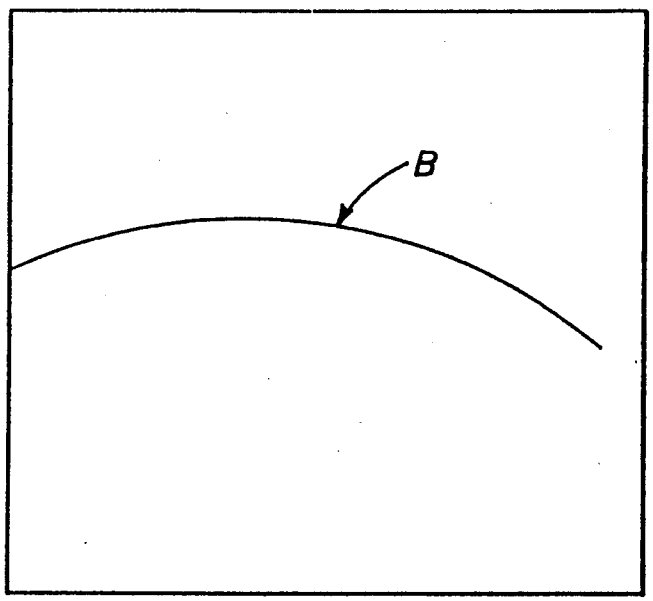
FIG. 2 is a plot of concentration versus depth of a first conductivity implant impurity of the FIG. 1 wafer.
Figure 3:
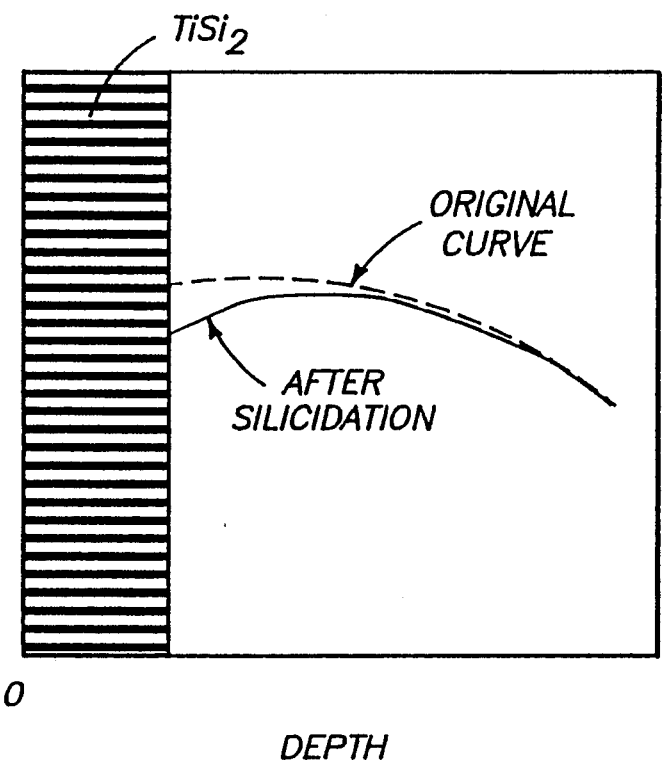
FIG. 3 is a plot of concentration versus depth of the conductivity enhancing impurity immediately after the processing depicted by FIG. 1B.
Figure 4:
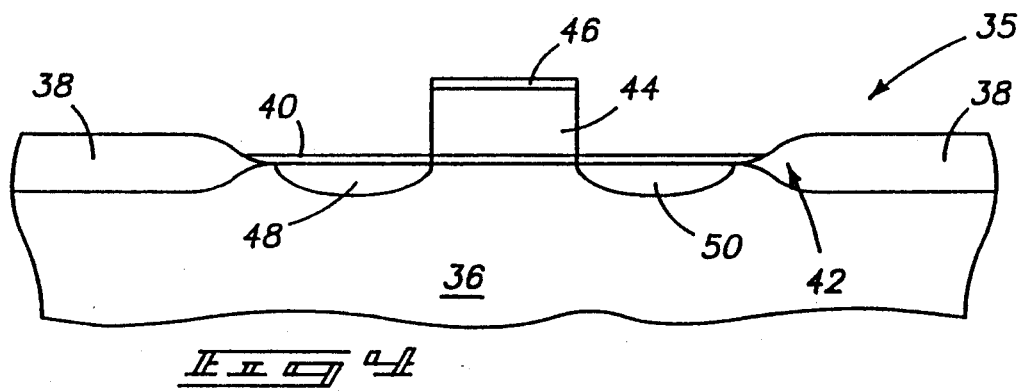
FIG. 4 is a cross sectional view of a semiconductor wafer at one processing step in accordance with the invention.

The discussion proceeds with reference to FIGS. 4–13. Referring first to FIG. 4, there illustrated is a semiconductor wafer fragment 35 comprised of a bulk substrate 36, which is provided with field oxide regions 38 and gate oxide regions 40. For purposes of the continuing discussion, silicon wafer 35 has a starting upper silicon surface 42. A layer of polysilicon has been applied atop field oxide layer 38 and gate oxide layer 40 and patterned as indicated to form a polysilicon gate 44. Gate 44 is illustrated of being of the preferred conventional sandwich construction, having an upper layer 46 of $WSi_x$.

Figure 5:
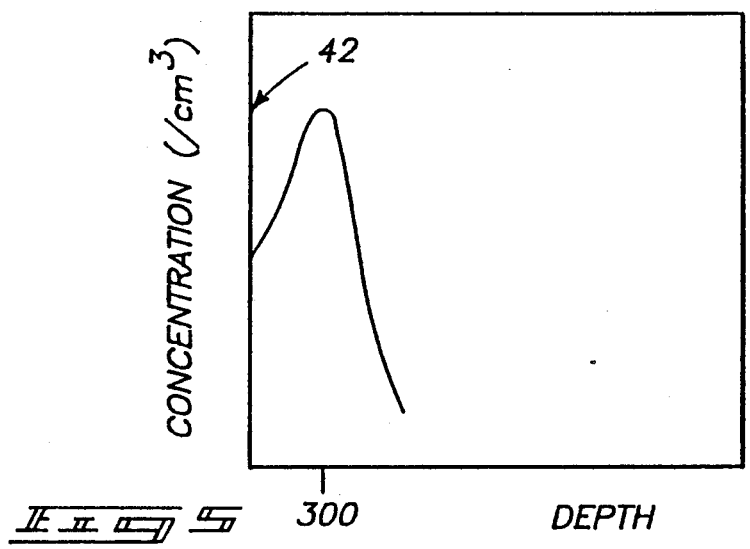
FIG. 5 is a graphical depiction of concentration versus depth (elevation) within the substrate of the FIG. 4 wafer immediately after conductivity enhancing impurity implant.

A first type conductivity enhancing impurity is implanted into silicon wafer 35 to a first peak density at a first elevation (depth) relative to starting upper silicon surface 42 to define source/drain regions 48, 50. Such first type conductivity implanting occurs after formation of field oxide regions 38 and gate oxide layer 40. The first conductivity type material would typically be boron for p-channel devices, and typically be phosphorus for n-channel devices. The invention is expected to have particular applicability to p-channel devices. Preferably, the first peak density is attained from an ion implantation of the first type conductivity enhancing impurity (whether phosphorus or boron) at a dose of from about $1 \times 10^{15}$ to about $1 \times 10^{16}$ atoms/cm$^2$ at an energy ranging from about 30 KeV to about 80 KeV. Most preferably, the first peak density is attained from an ion implantation of the first conductivity enhancing impurity at a dose of about $5 \times 10^{15}$ atoms/cm$^2$ at an energy ranging from about 50 to about 60 KeV. The preferred method for implanting boron is to provide an implant dose using $BF_2$ at $5 \times 10^{15}$ at 60 KeV. The preferred dose for a phosphorus implant is at $5 \times 10^{15}$ at 50 KeV. The first elevation of the first peak density is preferably from about 150 Angstroms to about 450 Angstroms from starting upper silicon 42, with about 300 Angstroms being most preferred. FIG. 5 diagrammatically illustrates such a profile.

Figure 6:
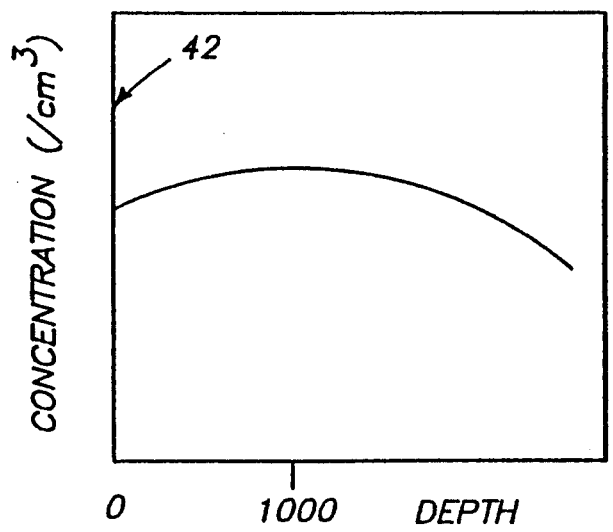
FIG. 6 is a graphical depiction of concentration versus elevation of the FIG. 4 wafer after post-implant anneal.

Next, a post-implant anneal of active areas 48, 50 is conducted to transform the first peak density at the first elevation into a second peak density at a second elevation relative to starting upper silicon surface 42, with the second peak density being less than the first peak density, and the second elevation being below the first elevation. Such post-implant anneal also repairs crystal damage imparted to the wafer the result of the first conductivity type material implant. The anneal also electrically enables active areas 48, 50 by substitution of the conductivity enhancing impurity within the repaired silicon lattice. The post implant anneal will preferably produce a lesser (deeper) second elevation from about 750 Angstroms to about 1500 Angstroms from starting upper surface 42, with 1000 Angstroms being most preferred The post-implant anneal will most typically provide a reduced second peak density as compared to the first peak density of approximately 40 percent depending upon the annealing conditions. The profile of the conductivity enhancing impurity within active areas 48, 50 the result of the anneal is illustrated by FIG. 6.

Referring to FIG. 7, a layer of insulating dielectric 52 (such as BPSG) is applied atop the wafer, and selectively patterned and etched to provide a contact opening 54 to active area 50. Contact opening 54 upwardly exposes only a portion of the silicon of active area 50, as opposed to the entire portion of active area 50, for reasons which are more fully explained below.

After annealing of active areas 48, 50 as described above, germanium is implanted through contact opening 54 and into active area 50 to a third peak density at a third elevation relative to starting upper silicon surface 42. The third elevation is at or above the second elevation. FIGS. 8 and 9 depict a germanium region 56 having been implanted to the third peak density at a third elevation "A" (FIG. 9). FIG. 9 also illustrates a second elevation "B" at which the post-implant anneal second peak density of the conductivity enhancing impurity occurs within active region 50.

Figure 10:
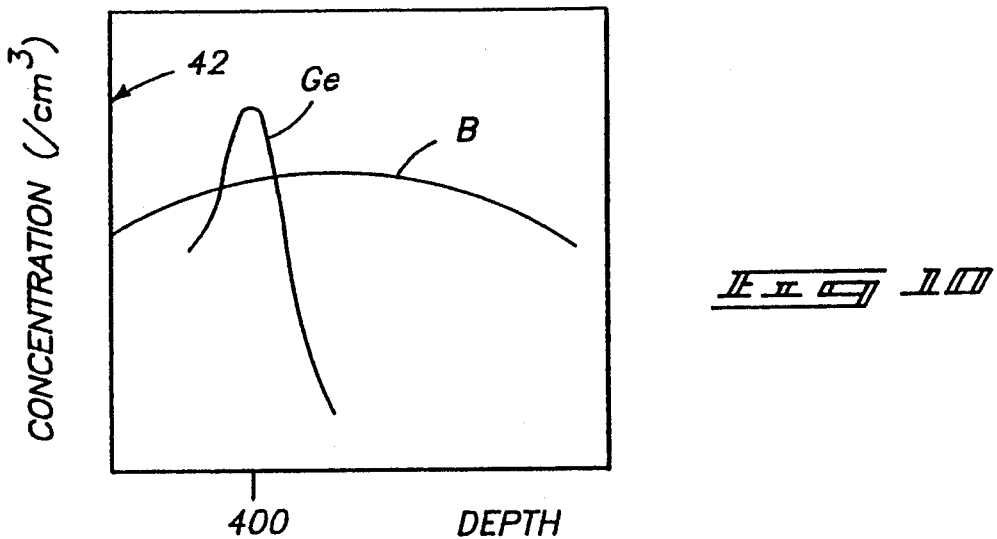
FIG. 10 is a graphical depiction of concentration versus elevation of the FIGS. 8 and 9 wafer.

The third peak density is preferably attained from an ion implantation of germanium at a dose of from about $5 \times 10^{13}$ to about $1 \times 10^{15}$ atoms/cm$^2$ at an energy ranging from about 30 KeV to about 125 KeV. Most preferred, the third peak density is attained from an ion implantation of the germanium at a dose of about $1 \times 10^{14}$ atoms/cm$^2$ at an energy of about 50 KeV. The preferred third elevation is from about 250 Angstroms to about 850 Angstroms from starting upper silicon surface 42, with 400 Angstroms being most preferred. FIG. 10 is a graphical depiction of concentration versus elevation for the implanted germanium and post-anneal first type conductivity implant.

Figure 11:
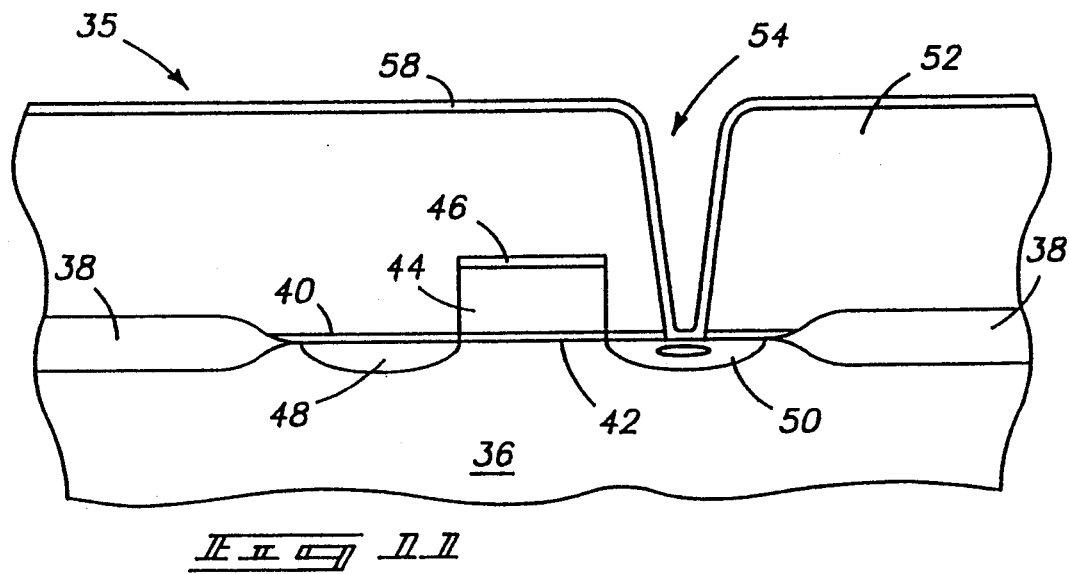
FIG. 11 is a sectional view of the FIG. 4 wafer illustrated at a processing step subsequent to that shown by FIGS. 8 and 9.

Referring to FIG. 11, a layer 58 of metal, preferably titanium, is applied atop the wafer and into contact opening 54 to contact active area 50. Metal within contact opening 56 contacts the upper surface of silicon containing active area 50. A typical thickness for layer 58 would be 200 Angstrom at the base of the contact.

Figure 12:
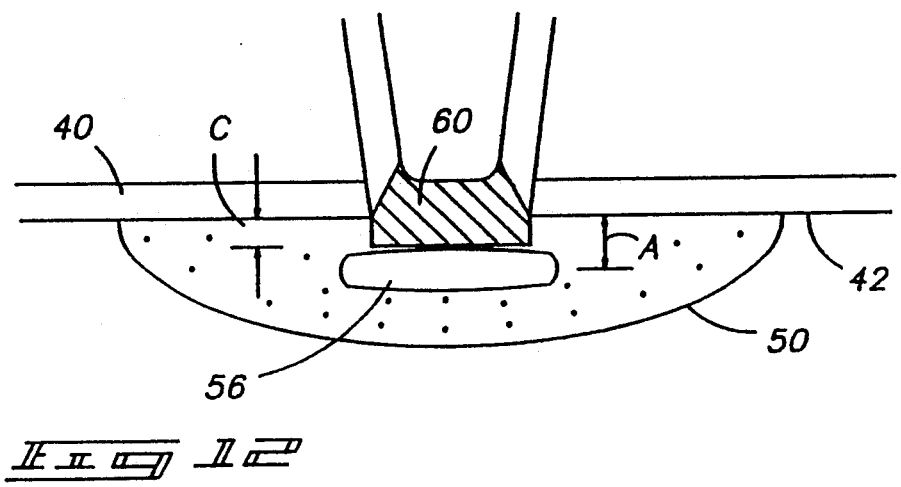
FIG. 12 is an enlarged view of a portion of the FIG. 11 wafer illustrated at a processing step subsequent to that shown by FIG. 11.

After implanting the germanium, the contacting metal and silicon within contact opening 54 are annealed to form a metal silicide region 60, such as is depicted by FIG. 12. Such annealing step consumes elemental silicon into the wafer to a fourth elevation, represented by distance "C" in FIG. 12, relative to starting upper silicon surface 42 in the formation of silicide region 60. Such fourth elevation is at or above the third elevation defined by the peak density implant of the germanium. During such anneal, the germanium restricts diffusion of the conductivity enhancing impurity therethrough.

During formation of the silicide, typically the same thickness of silicon will be consumed as the thickness of the deposited metal. However, the overall thickness of the silicide will typically be less than twice the thickness of the deposited titanium due to a higher density of the finished silicide from that of the elemental metal and silicon of the substrate. The preferred range of thickness for metal deposition is from about 100 Angstroms to about 400 Angstroms, with about 200 Angstroms being most preferred. Therefore, 100 Angstroms of the metal will consume approximately 100 Angstroms of the silicon; a 400 Angstrom thick layer of metal will consume approximately 400 Angstroms of silicon; and a 200 Angstrom thick layer of metal will consume approximately 200 Angstroms of silicon. Accordingly, the fourth elevation is preferably from about 100 Angstroms to about 400 Angstroms from starting upper silicon surface 42, with about 200 Angstroms being most preferred. Because of the density differences, a 100 Angstrom layer of metal will produce a finished silicide thickness of approximately 175 Angstroms. A 200 Angstrom thick layer of elemental titanium will produce a TiSi$_2$ of approximately 350 Angstroms. A 400 Angstrom thick layer of titanium will produce a 700 Angstrom thick layer of TiSi$_2$.

A product processed in accordance with the invention is a significant improvement over the prior art lending to the reduced contact resistance the result of the germanium implant preventing impurity diffusion into the silicide. Germanium itself is electrically neutral and has a negligible impact on conductivity/resistivity.

Figure 13:
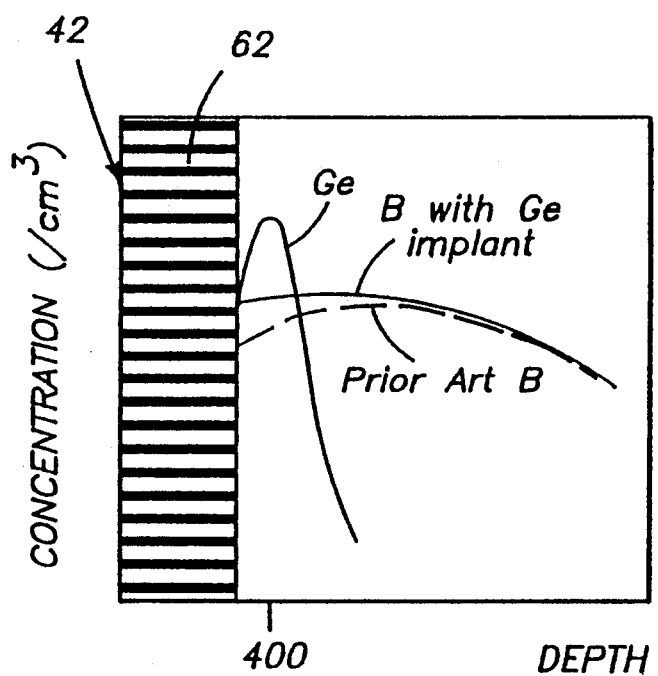
FIG. 13 is a graphical depiction of concentration versus elevation of the FIG. 12 wafer.

FIG. 13 is a graphical depiction of the various concentrations as a function of elevation of the FIG. 12 wafer. Region 62 of the FIG. 13 graph depicts the silicide which has formed from original upper surface silicon 42 into a wafer to a point which is just above the peak density elevation at 400 Angstroms of the germanium.

The above described sequence of methods is the preferred for carrying out the invention, however such is not intended to be limiting to invention scope. As one example, it would be possible to first apply layer 58 atop the wafer within contact opening 54 before implantation of germanium. Germanium could thereafter be implanted through the metal layer 58. Such would however have the drawback of requiring higher implant energies to obtain the desired depth profile, which may have a tendency to further damage the silicon substrate 36. It is, however, necessary that the germanium be implanted before silicidation anneal.

As is apparent, germanium is implanted within a small region of active area 50, and is preferably not applied over the entire active area 50. This is a principle reason why contact opening 54 only upwardly exposes a portion of active area 50. Some diffusion of the conductivity enhancing impurity within active regions 50 upon activation anneal is desirable in a downward direction, as well as a sideward direction towards the gate. Applying germanium everywhere within the active area would defeat this otherwise desirable diffusion at these boundaries.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. Integrated circuitry having reduced contact resistance between an active area and an overlying silicide resulting from diffusion of an impurity from the active area into the silicide, the integrated circuitry being produced according to a method comprising the following steps:

providing field oxide regions atop a silicon wafer, the silicon wafer having a starting upper silicon surface;

implanting a first type conductivity enhancing impurity into the silicon wafer to a first peak density at a first elevation relative to the starting upper silicon surface to define an active area, the first type conductivity implanting occurring after provision of the field oxide regions;

post-implant annealing the active area to, a) transform the first peak density at the first elevation into a second peak density at a second elevation relative to the starting upper silicon surface, the second peak density being less than the first peak density, the second elevation being below the first elevation, the second elevation being from about 750 Angstroms to about 1500 Angstroms from the starting upper silicon surface b) repair crystal damage imparted to the wafer the result of the implant, and c) electrically enable the active area;

providing a layer of insulating dielectric atop the wafer;

selectively patterning and etching the insulating dielectric to provide a contact opening to the active area, the contact opening upwardly exposing only a portion of the silicon of the active area;

after annealing the active area, implanting germanium through the contact opening and into the active area of the wafer to a third peak density at a third elevation relative to the starting upper silicon surface, the third elevation being at or above the second elevation, the third elevation being from about 250 Angstroms to about 850 Angstroms from the starting upper silicon surface;

applying a layer of metal atop the wafer and into the contact opening to contact the active area, the metal within the contact engaging an upper surface of the silicon of the active area; and after implanting the germanium, annealing the metal and silicon within the contact opening to form a metal silicide; the annealing step consuming elemental silicon into the wafer to a fourth elevation relative to the starting upper silicon surface in formation of the silicide, the fourth elevation being at or above the third elevation, the fourth elevation being from about 100 Angstroms to about 400 Angstroms from the starting upper silicon surface, the germanium restricting diffusion of the conductivity enhancing impurity therethrough during the silicide annealing.

2. Integrated circuitry produced according to a method comprising the following sequential steps:

providing field oxide and gate oxide regions atop a silicon wafer, the silicon wafer having a starting upper silicon surface;

applying a layer of polysilicon atop the wafer and patterning the polysilicon layer to form polysilicon gates atop the gate oxide regions;

implanting a first type conductivity enhancing impurity into the silicon wafer to a first peak density at a first elevation relative to the starting upper silicon surface to define an active area;

post-implant annealing the active area to, a) transform the first peak density at the first elevation into a second peak density at a second elevation relative to the starting upper silicon surface, the second peak density being less than the first peak density, the second elevation being below the first elevation, the second elevation being from about 750 Angstroms to about 1500 Angstroms from the starting upper silicon surface b) repair crystal damage imparted to the wafer the result of the implant, and c) electrically enable the active area;

providing a layer of insulating dielectric atop the wafer;

selectively patterning and etching the insulating dielectric to provide a contact opening to the active area, the contact opening upwardly exposing only a portion of the silicon of the active area;

implanting germanium through the contact opening and into the active area of the wafer to a third peak density at a third elevation relative to the starting upper silicon surface, the third elevation being at or above the second elevation, the third elevation being from about 250 Angstroms to about 850 Angstroms from the starting upper silicon surface;

applying a layer of metal atop the wafer and into the contact opening to contact the active area, the metal within the contact engaging an upper surface of the silicon of the active area; and annealing the metal and silicon within the contact opening to form a metal silicide; the annealing step consuming elemental silicon into the wafer to a fourth elevation relative to the starting upper silicon surface in formation of the silicide, the fourth elevation being at or above the third elevation, the fourth elevation being from about 100 Angstroms to about 400 Angstroms from the starting upper silicon surface, the germanium restricting diffusion of the conductivity enhancing impurity therethrough during the silicide annealing.

3. Integrated circuitry having reduced contact resistance between an active area and an overlying silicide resulting from diffusion of an impurity from the active area into the silicide, the integrated circuitry being produced according to a method comprising the following steps:

providing field oxide regions atop a silicon wafer, the silicon wafer having a starting upper silicon surface;

implanting a first type conductivity enhancing impurity into the silicon wafer to a first peak density at a first elevation relative to the starting upper silicon surface to define an active area, the first type conductivity implanting occurring after provision of the field oxide regions;

post-implant annealing the active area to, a) transform the first peak density at the first elevation into a second peak density at a second elevation relative to the starting upper silicon surface, the second peak density being less than the first peak density, the second elevation being below the first elevation, b) repair crystal damage imparted to the wafer the result of the implant, and c) electrically enable the active area;

providing a layer of insulating dielectric atop the wafer;

selectively patterning and etching the insulating dielectric to provide a contact opening to the active area, the contact opening upwardly exposing only a portion of the silicon of the active area;

after annealing the active area, implanting germanium through the contact opening and into the active area of the wafer to a third peak density at a third elevation relative to the starting upper silicon surface, the third elevation being at or above the second elevation, the third elevation being from about 250 Angstroms to about 850 Angstroms from the starting upper silicon surface;

applying a layer of metal atop the wafer and into the contact opening to contact the active area, the metal within the contact engaging an upper surface of the silicon of the active area; and after implanting the germanium, annealing the metal and silicon within the contact opening to form a metal silicide; the annealing step consuming elemental silicon into the wafer to a fourth elevation relative to the starting upper silicon surface in formation of the silicide, the fourth elevation being at or above the third elevation, the germanium restricting diffusion of the conductivity enhancing impurity therethrough during the silicide annealing.

4. Integrated circuitry having reduced contact resistance between an active area and an overlying silicide resulting from diffusion of an impurity from the active area into the silicide, the integrated circuitry being produced according to a method comprising the following steps:

provide field oxide regions atop a silicon wafer, the silicon wafer having a starting upper silicon surface;

implanting a first type conductivity enhancing impurity into the silicon wafer to a first peak density at a first elevation relative to the starting upper silicon surface to define an active area, the first type conductivity implanting occurring after provision of the field oxide regions;

post-implant annealing the active area to, a) transform the first peak density at the first elevation into a second peak density at a second elevation relative to the starting upper silicon surface, the second peak density being less than the first peak density, the second elevation being below the first elevation, b) repair crystal damage imparted to the wafer the result of the implant, and c) electrically enable the active area;

providing a layer of insulating dielectric atop the wafer;

selectively patterning and etching the insulating dielectric to provide a contact opening to the active area, the contact opening upwardly exposing only a portion of the silicon of the active area;

after annealing the active area, implanting germanium through the contact opening and into the active area of the wafer to a third peak density at a third elevation relative to the starting upper silicon surface, the third elevation being at or above the second elevation, the third elevation being from about 250 Angstroms to about 850 Angstroms from the starting upper silicon surface;

applying a layer of metal atop the wafer and into the contact opening to contact the active area, the metal within the contact engaging an upper surface of the silicon of the active area; and after implanting the germanium, annealing the metal and silicon within the contact opening to form a metal silicide; the annealing step consuming elemental silicon into the wafer to a fourth elevation relative to the starting upper silicon surface in formation of the silicide, the fourth elevation being at or above the third elevation, the fourth elevation being from about 100 Angstroms to about 400 Angstroms from the starting upper silicon surface, the germanium restricting diffusion of the conductivity enhancing impurity therethrough during the silicide annealing.

5. Integrated circuitry having reduced contact resistance between an active area and an overlying silicide resulting from diffusion of an impurity from the active area into the silicide, the integrated circuitry being produced according to a method comprising the following steps:

providing field oxide regions atop a silicon wafer, the silicon wafer having a starting upper silicon surface;

implanting a first type conductivity enhancing impurity into the silicon wafer to a first peak density at a first elevation relative to the starting upper silicon surface to define an active area, the first type conductivity implanting occurring after provision of the field oxide regions;

post-implant annealing the active area to, a) transform the first peak density at the first elevation into a second peak density at a second elevation relative to the starting upper silicon surface, the second peak density being less than the first peak density, the second elevation being below the first elevation, the second elevation being from about 750 Angstroms to about 1500 Angstroms from the starting upper silicon surface b) repair crystal damage imparted to the wafer the result of the implant, and c) electrically enable the active area;

providing a layer of insulating dielectric atop the wafer;

selectively patterning and etching the insulating dielectric to provide a contact opening to the active area, the contact opening upwardly exposing only a portion of the silicon of the active area;

after annealing the active area, implanting germanium through the contact opening and into the active area of the wafer to a third peak density at a third elevation relative to the starting upper silicon surface, the third elevation being at or above the second elevation, the third elevation being from about 250 Angstroms to about 850 Angstroms from the starting upper silicon surface;

applying a layer of metal atop the wafer and into the contact opening to contact the active area, the metal within the contact engaging an upper surface of the silicon of the active area; and after implanting the germanium, annealing the metal and silicon within the contact opening to form a metal silicide; the annealing step consuming elemental silicon into the wafer to a fourth elevation relative to the starting upper silicon surface in formation of the silicide, the fourth elevation being at or above the third elevation, the germanium restricting diffusion of the conductivity enhancing impurity therethrough during the silicide annealing.

6. Integrated circuitry produced according to a method comprising the following sequential steps:

providing field oxide and gate oxide regions atop a silicon wafer, the silicon wafer having a starting upper silicon surface;

applying a layer of polysilicon atop the wafer and patterning the polysilicon layer to form polysilicon gates atop the gate oxide regions;

implanting a first type conductivity enhancing impurity into the silicon wafer to a first peak density at a first elevation relative to the starting upper silicon surface to define an active area;

post-implant annealing the active area to, a) transform the first peak density at the first elevation into a second peak density at a second elevation relative to the starting upper silicon surface, the second peak density being less than the first peak density, the second elevation being below the first elevation, b) repair crystal damage imparted to the wafer the result of the implant, and c) electrically enable the active area;

providing a layer of insulating dielectric atop the wafer;

selectively patterning and etching the insulating dielectric to provide a contact opening to the active area, the contact opening upwardly exposing only a portion of the silicon of the active area;

implanting germanium through the contact opening and into the active area of the wafer to a third peak density at a third elevation relative to the starting upper silicon surface, the third elevation being at or above the second elevation, the third elevation being from about 250 Angstroms to about 850 Angstroms from the starting upper silicon surface;

applying a layer of metal atop the wafer and into the contact opening to contact the active area, the metal within the contact engaging an upper surface of the silicon of the active area; and annealing the metal and silicon within the contact opening to form a metal silicide; the annealing step consuming elemental silicon into the wafer to a fourth elevation relative to the starting upper silicon surface in formation of the silicide, the fourth elevation being at or above the third elevation, the germanium restricting diffusion of the conductivity enhancing impurity therethrough during the silicide annealing.

7. Integrated circuitry produced according to a method comprising the following sequential steps:

providing field oxide and gate oxide regions atop a silicon wafer, the silicon wafer having a starting upper silicon surface;

applying a layer of polysilicon atop the wafer and patterning the polysilicon layer to form polysilicon gates atop the gate oxide regions;

implanting a first type conductivity enhancing impurity into the silicon wafer to a first peak density at a first elevation relative to the starting upper silicon surface to define an active area;

post-implant annealing the active area to, a) transform the first peak density at the first elevation into a second peak density at a second elevation relative to the starting upper silicon surface, the second peak density being less than the first peak density, the second elevation being below the first elevation, b) repair crystal damage imparted to the wafer the result of the implant, and c) electrically enable the active area;

providing a layer of insulating dielectric atop the wafer;

selectively patterning and etching the insulating dielectric to provide a contact opening to the active area, the contact opening upwardly exposing only a portion of the silicon of the active area;

implanting germanium through the contact opening and into the active area of the wafer to a third peak density at a third elevation relative to the starting upper silicon surface, the third elevation being at or above the second elevation, the third elevation being from about 250 Angstroms to about 850 Angstroms from the starting upper silicon surface;

applying a layer of metal atop the wafer and into the contact opening to contact the active area, the metal within the contact engaging an upper surface of the silicon of the active area; and annealing the metal and silicon within the contact opening to form a metal silicide; the annealing step consuming elemental silicon into the wafer to a fourth elevation relative to the starting upper silicon surface in formation of the silicide, the fourth elevation being at or above the third elevation, the fourth elevation being from about 100 Angstroms to about 400 Angstroms from the starting upper silicon surface, the germanium restricting diffusion of the conductivity enhancing impurity therethrough during the silicide annealing.

8. Integrated circuitry produced according to a method comprising the following sequential steps:

providing field oxide and gate oxide regions atop a silicon wafer, the silicon wafer having a starting upper silicon surface;

applying a layer of polysilicon atop the wafer and patterning the polysilicon layer to form polysilicon gates atop the gate oxide regions;

implanting a first type conductivity enhancing impurity into the silicon wafer to a first peak density at a first elevation relative to the starting upper silicon surface to define an active area;

post-implant annealing the active area to, a) transform the first peak density at the first elevation into a second peak density at a second elevation relative to the starting upper silicon surface, the second peak density being less than the first peak density, the second elevation being below the first elevation, the second elevation being from about 750 Angstroms to about 1500 Angstroms from the starting upper silicon surface, b) repair crystal damage imparted to the wafer the result of the implant, and c) electrically enable the active area;

providing a layer of insulating dielectric atop the wafer;

selectively patterning and etching the insulating dielectric to provide a contact opening to the active area, the contact opening upwardly exposing only a portion of the silicon of the active area;

implanting germanium through the contact opening and into the active area of the wafer to a third peak density at a third elevation relative to the starting upper silicon surface, the third elevation being at or above the second elevation, the third elevation being from about 250 Angstroms to about 850 Angstroms from the starting upper silicon surface;

applying a layer of metal atop the wafer and into the contact opening to contact the active area, the metal within the contact engaging an upper surface of the silicon of the active area; and annealing the metal and silicon within the contact opening to form a metal silicide; the annealing step consuming elemental silicon into the wafer to a fourth elevation relative to the starting upper silicon surface in formation of the silicide, the fourth elevation being at or above the third elevation, the germanium restricting diffusion of the conductivity enhancing impurity therethrough during the silicide annealing.

9. An electronic component of integrated circuitry formed within a silicon semiconductor substrate comprising:

an electrically enabled active area formed within the silicon substrate, the active area having an uppermost surface, the active area comprising a first type conductivity enhancing impurity having a dopant peak density at an active area elevation from the uppermost surface;

the active area including a region of germanium atoms having a dopant peak density at a germanium elevation from the uppermost surface and within the active area, the germanium elevation being at or above the active area elevation; and a region of metal silicide projecting into the active area from the active area upper surface, the region of metal silicide having a terminus base positioned within the active area at a silicide elevation, the terminus base silicide elevation being from about 150 Angstroms to about 450 Angstroms above the germanium elevation.

* * * * *